United States Patent [19]

Tsang et al.

[11] 4,250,570
[45] Feb. 10, 1981

[54] REDUNDANT MEMORY CIRCUIT

[75] Inventors: Frederick Tsang, Saratoga; Gregory A. Kannal, Mountain View; Marcian E. Hoff, Jr., Sunnyvale, all of Calif.

[73] Assignee: Intel Corporation, Santa Clara, Calif.

[21] Appl. No.: 867,779

[22] Filed: Jan. 9, 1978

Related U.S. Application Data

[63] Continuation of Ser. No. 705,597, Jul. 15, 1976, abandoned.

[51] Int. Cl.³ .............................................. G11C 11/40
[52] U.S. Cl. .................................... 365/200; 365/210; 307/238
[58] Field of Search ............... 365/200, 207, 210, 104, 365/105; 307/238

[56] References Cited

U.S. PATENT DOCUMENTS

| | | | |
|---|---|---|---|
| 3,753,244 | 8/1973 | Sumilas | 365/104 |
| 4,007,452 | 2/1977 | Hoff | 365/104 |

Primary Examiner—Terrell W. Fears
Attorney, Agent, or Firm—Blakely, Sokoloff, Taylor & Zafman

[57] ABSTRACT

A redundant memory circuit for a memory array in which the memory has a preselected number of rows and columns having addresses associated therewith and decoders coupled thereto and one or more redundant rows or columns having initially unspecified addresses associated therewith and redundant decoders coupled thereto. The redundant memory circuit programs the redundant decoders coupled to the redundant rows or columns having initially unspecified addresses to match the addresses of defective rows or columns having addresses associated therewith and disables one or more of the defective rows or columns having addresses associated therewith.

12 Claims, 3 Drawing Figures

REDUNDANT MEMORY CIRCUIT

This is a continuation of application Ser. No. 705,597, filed July 15, 1976, now abandoned.

BACKGROUND OF THE INVENTION

1. Field of the Invention

The invention relates to the field of memory arrays and in particular to circuitry for providing on-chip redundancy for said memory arrays.

2. Prior Art

A memory array, such as a programmable read-only memory array (PROM) or a random access memory array (RAM), generally comprises an array of binary elements arranged in a matrix of rows and columns have addresses associated therewith and decoders coupled thereto. The binary elements in the RAM can be both written into and read out of; the binary elements in the PROM are either permanently or semi-permanently programmed to one of two states so that information stored in the memory can only be read out of, and not written into, the memory. A particularly advantageous method of making a PROM memory employing fusible silicon links is described in U.S. Pat. No. 3,792,319 to Frederick Tsang, entitled Poly-Crystalline Silicon Fusible Links for Programmable Read-Only Memories, in which the programmable element is a fusible link which presents a low impedance path when intact or a high impedance path when blown. In the manufacture of such memory arrays processing defects often randomly occur across the memory chip and are responsible for many memory chips which are functional except for a single row or column containing a defective bit. While the prior art memories have provided redundant rows and columns to replace such defective rows and columns, the repair of such memories requires that the memories and the external connections thereto be rewired so that such redundant rows and columns can be coupled into the processing circuitry in place of the defective rows and columns if the same address is to be retained.

Accordingly it is a general object of the present invention to provide an improved redundant memory circuit.

It is another object of the present invention to provide an improved redundant memory circuit which replaces defective rows or columns of a memory array without any rewiring of the memory array or the external connections thereto.

It is yet another object of the present invention to provide an improved redundant memory circuit which disables the defective rows or columns of a memory array and replaces them with rows or columns having the same address.

SUMMARY OF THE INVENTION

A redundant memory circuit useful for repairing defective memory arrays and particularly suited for repairing programmable read-only memory arrays and random access memory arrays is provided. In one embodiment, the memory has a preselected number of rows and columns having addresses associated therewith and decoders coupled thereto and one or more redundant rows or columns having initially unspecified addresses associated therewith and redundant decoders coupled thereto and the redundant memory circuit programs the redundant decoders coupled to the redundant rows or columns having initially unspecified addresses to match the addresses of defective rows or columns having addresses associated therewith and disables the defective rows or columns having addresses associated therewith. In a second embodiment, the redundant memory circuit programs the redundant decoders coupled to the redundant rows or columns having initially unspecified addresses to match the addresses of the defective rows or columns having addresses associated therewith and disables all of the rows or columns when one of the redundant rows or columns is being addressed.

The novel features which are believed to be characteristic of the invention, both as to its organization and its method of operation, together with further objects and advantages thereof, will be better understood from the following description in connection with the accompanying drawings in which a presently preferred embodiment of the invention is illustrated by way of example. It is to be expressly understood, however, that the drawings are for purposes of illustration and description only and are not intended as a definition of the limits of the invention.

DETAILED DESCRIPTION OF THE INVENTION

A redundant memory circuit useful for repairing defective memory arrays and particulary suited for repairing programmable read-only memory arrays and random access memory arrays is provided. The memory array comprises a plurality of storage cells arranged in rows and columns with each row and column having an address associated therewith and a decoder which determines whether or not the particular row or column is being addressed. The memory array has in addition one or more redundant rows and/or columns having initially unspecified addresses and an unprogrammed decoder associated therewith.

Figure 1:
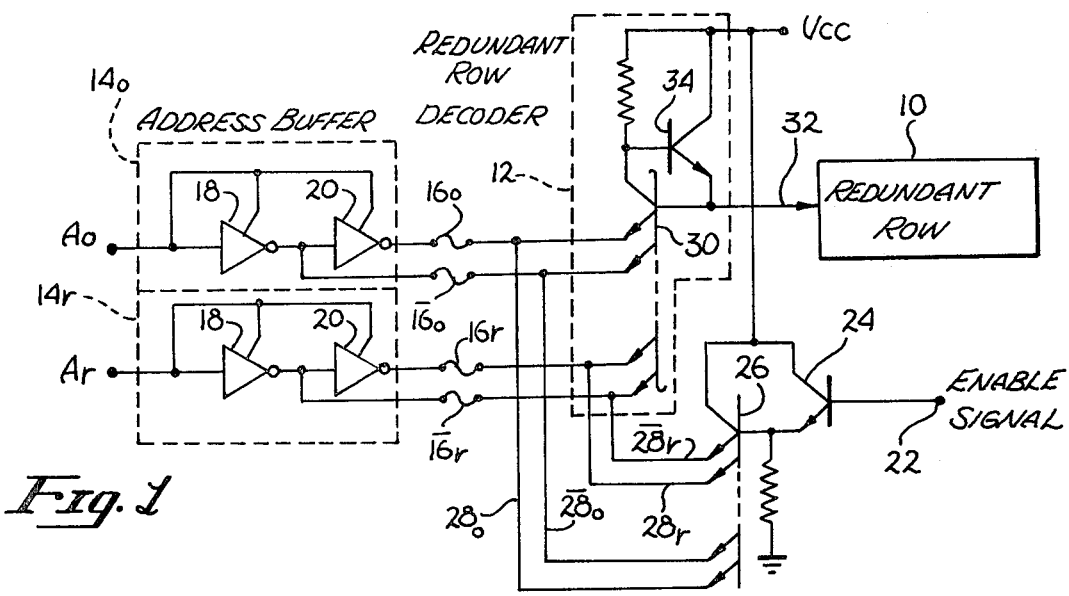
FIG. 1 is a schematic illustration of a circuit for programming a redundant decoder in accordance with the teachings of the present invention.

Referring to FIG. 1, a circuit for programming a redundant decoder is schematically illustrated. A redundant row 10 is shown coupled to a redundant row decoder 12 which is in turn coupled to plurality of address buffers $14_0 \ldots 14_r$ by a plurality of fuses $16_0, \overline{16}_0 \ldots 16_r, \overline{16}_r$. The fuses $16_0 \ldots \overline{16}_r$ may comprise silicon fusible links. The address buffers $14_0 \ldots 14_r$ have applied to them a row address signal via terminals $A_0 \ldots A_r$ and by means of inverters 18 and 20 produce complementary address output signals which are applied to the fuses $16_r \ldots \overline{16}_r$. When a particular row is found to be defective the address of such row is applied to the terminals $A_0 \ldots A_r$ and an enable signal is applied to terminal 22 to turn on transistor 24 and multi-emitter transistor 26. Current from transistor 26 is applied to the fuses $16_r \ldots \overline{16}_r$ via leads $28_0 \ldots \overline{28}_r$ and is sunk by the address buffers $14_0 \ldots 14_r$. The current through the fuses $16_r \ldots \overline{16}_r$ is sufficient to blow those fuses which are coupled to inverters 18 and 20 in a low impedance state and would be on the order of 30 ma for silicon fusible links. If it is desirable because of the high fusing current to blow only one fuse at a time, three-state address buffers may be employed with the input to each address buffer being set to the appropriate input voltage level sequentially while all the other address inputs are set at a sufficiently high voltage such that they are forced into a high impedance state.

After the appropriate fuses $16_o \ldots \overline{16}_r$ are blown the redundant row decoder will only respond to the address of the defective row since all of the emitters of the multi-emitter transistor 30 must be in a high-state for line 32 to be in a high state, due to voltage $V_{cc}$ and transistor 34. If any of the emitters of the transistor 30 are in a low state, line 32 will be in a low state and no response will be sensed on a sense line, not shown, for the redundant row 10. Thus, if the address of the defective row is 11, then fuses $\overline{16}_o$ and $\overline{16}_1$ would be blown and the emitters of transistor 30 would be in a high state for address 11 and at least one emitter would be in a low state for addresses 00, 10, and 01.

Figure 2:
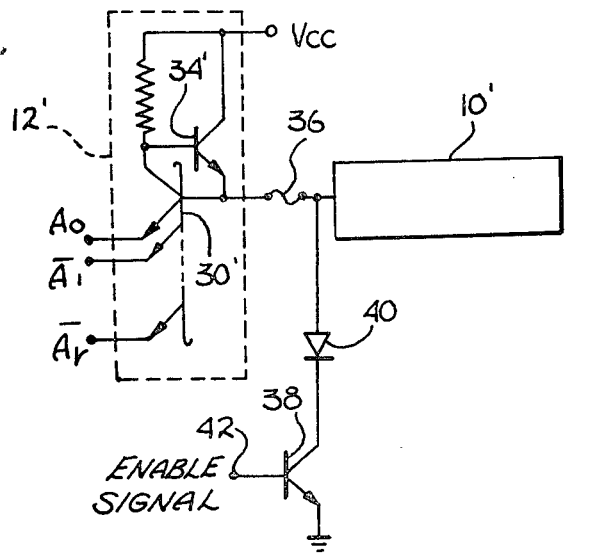
FIG. 2 is a schematic illustration of a circuit for disabling a defective row in accordance with the teachings of the present invention.

Referring to FIG. 2, a circuit for disabling a defective row is schematically illustrated. A defective row 10' is shown coupled to a fuse 36 which in turn is coupled to a decoder 12' comprising transistor 34' and multiple-emitter transistor 30'. The fuse 36 is also coupled to a transistor 38 via diode 40. When the row 10' is addressed by the appropriate row address signal via terminals $A_o, \overline{A}_1 \ldots \overline{A}_r$, an enable signal is applied to terminal 42 to turn on the transistor 38 thus allowing the decoder 12' to source current through the fuse 36 and blowing such fuse 36. Thus the defective row 10' is disabled and the circuitry discribed in connection with FIG. 1 would program redundant row 10 to match the address of defective row 10'.

Figure 3:
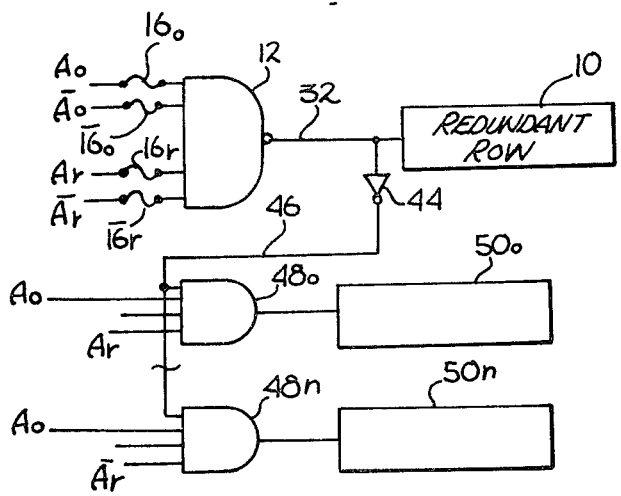
FIG. 3 is a block diagram of a circuit for disabling an array of rows when a redundant row is addressed in accordance with the teaching of the present invention.

Referring to FIG. 3, a block diagram of a circuit for disabling an array of rows when a redundant row is addressed as illustrated. The redundant row 10 is coupled via line 32 to the redundant row decoder 12, here shown as an AND gate, as previously described in connection with FIG. 1, with fuses $16_o \ldots \overline{16}_r$ being coupled to the decoder 12 and the address terminals $A_o \ldots A_r$. The address buffers $14_o \ldots 14_r$ and the circuitry to blow the fuses $16_o \ldots \overline{16}_r$ have been deleted for simplicity. The line 32 is coupled via inverter 44 and line 46 to the inputs of decoders $48_o \ldots 48_n$ associated with rows $50_o \ldots 50_n$. Decoders $48_o \ldots 48_n$ have previously been programmed to have addresses associated therewith. When the redundant row 10 is unprogrammed or is programmed but not addressed, line 32 is in a low state and line 46 is in a high state due to inverter 44, thus enabling rows $50_o \ldots 50_n$ to be addressed. When decoder 12 and redundant row 10, have been programmed to have the same address as a defective row, addressing the defective row will cause line 32 to go to a high state and line 46 to go to a low state. When line 46 goes to a low state, one emitter of each of the decoders $48_o \ldots 48_n$ will go to a low state thus disabling rows $50_o \ldots 50_n$, including the defective row in the array.

Since all of the redundant rows, the redundant row decoders, the address buffers, the fuses and the circuitry for blowing the fuses can be placed on a single memory chip, it is apparent that once a defective row has been found, a redundant row can be inserted in its place by merely programming a redundant row decoder to match the address of the defective row without having to rewire the memory array or change any external connections thereto. The defective row can then be easily disabled or the entire array except for the programmed redundant row can be disabled when the programmed redundant row is addressed, again without any rewiring of the memory array or changes to any external connections thereto. The present invention is thus seen most suitable for high density single chip memory arrays.

Having described the invention, it is obvious that numerous modifications and departures may be made in the programming of the redundant decoders and the disabling of the defective rows or columns of the memory array by those skilled in the art; thus, the invention is to be construed as being limited only by the spirit and scope of the appended claims.

What is claimed is:

1. A redundant memory circuit for a memory array comprising:

a memory having a preselected number of rows and columns having addresses associated therewith, each of said rows and columns having an individual decoder coupled thereto, and one or more redundant rows or columns having initially unspecified addresses associated therewith, each of said redundant rows or columns having an individual redundant decoder coupled thereto;

programming means for causing the redundant decoders coupled to said redundant rows or columns having initially unspecified addresses to respond only to the addresses of defective rows or columns having addresses associated therewith; and means for disabling said defective rows or columns having addresses associated therewith.

2. The circuit of claim 1 wherein said means for disabling includes:

means for addressing a defective row or column;

fuse means coupled to said means for addressing and said row or column; and means coupled to said fuse means and operable for allowing sufficient current to flow through said fuse means to blow said fuse means, whereby said defective row or column is disabled.

3. The circuit of claim 2 wherein said means coupled to said fuse means for allowing sufficient current to flow therethrough includes a transistor and means for enabling said transistor.

4. The circuit of claim 1 wherein said programming means includes:

a plurality of fuses coupled to each of said redundant decoders and operable to be selectively blown;

address means for applying to one or more of said redundant rows or columns the addresses of one or more of said defective rows or columns, coupled to said fuses; and current means coupled to said fuses and coacting with said address means for allowing sufficient current to flow through selected ones of said fuses to blow said selected ones of said fuses.

5. The circuit of claim 4 wherein said current means includes a transistor and means for enabling said transistor.

6. The circuit of claim 4 wherein said address means includes a plurality of address buffers, each of said buffers having a single input and complementary outputs coupled to pairs of said fuses, whereby one of said pairs of fuses coupled to each address buffer is blown by the coaction of said address means and said current means.

7. The circuit of claim 6 wherein each of said address buffers includes a pair of series coupled inverters, each of said fuses being coupled to the output of one of said inverters.

8. The circuit defined by claim 4 wherein said fuses comprise silicon fusible links.

9. The circuit of claim 1 wherein said means for disabling includes means for disabling all of said rows or columns having addresses associated therewith when a programmed redundant row or column is addressed.

10. The circuit of claim 9 wherein said means for disabling also includes means for coupling said decoder of said redundant row or column to said decoders of said rows or columns having addresses associated therewith.

11. The circuit of claim 1 wherein said memory is a programmable read-only memory.

12. The circuit of claim 1 wherein said memory is a random access memory.

* * * * *

Disclaimer

B1 4,250,570—Frederick Tsang, Saratoga; Gregory A. Kannal, Mountain View; Marcian E. Hoff, Jr., Sunnyvale, all of California. REDUNDANT MEMORY CIRCUIT. Patent dated Jan. 2, 1996. Disclaimer filed Aug. 6, 1996, by the assignee, Intel Corporation.

Hereby enters this disclaimer to claims 14 and 15 of said patent.
*(Official Gazette,* August 26, 1997)

REEXAMINATION CERTIFICATE (2761th)

United States Patent [19]
Tsang et al.

[11] B1 4,250,570
[45] Certificate Issued Jan. 2, 1996

[54] REDUNDANT MEMORY CIRCUIT

[75] Inventors: Frederick Tsang, Saratoga; Gregory A. Kannal, Mountain View; Marcian E. Hoff, Jr., Sunnyvale, all of Calif.

[73] Assignee: Intel Corporation, Santa Clara, Calif.

Reexamination Request:
No. 90/003,594, Oct. 10, 1994

Reexamination Certificate for:
Patent No.: 4,250,570
Issued: Feb. 10, 1981
Appl. No.: 867,779
Filed: Jan. 9, 1978

Related U.S. Application Data

[63] Continuation of Ser. No. 705,597, Jul. 15, 1976, abandoned.

[51] Int. Cl.$^6$ ............ G11C 13/00; G11C 11/40
[52] U.S. Cl. ............ 365/200; 365/210

[56] References Cited

U.S. PATENT DOCUMENTS 3,721,838  3/1973  Brickman et al. ............ 307/303
4,051,354  9/1977  Choate ............ 235/312

OTHER PUBLICATIONS

N. F. Brickman, *Redundant Memory Cell and Decoder*, IBM Technical Disclosure Bulletin, vol. 13, No. 7 (Dec. 1970).

S. E. Schuster, *Selective Metalization Removal for Redundancy*, IBM Technical Disclosure Bulletin, vol. 15, No. 2 (Jul. 1972).

*Primary Examiner*—Terrell W. Fears

[57] ABSTRACT

A redundant memory circuit for a memory array in which the memory has a preselected number of rows and columns having addresses associated therewith and decoders coupled thereto and one or more redundant rows or columns having initially unspecified addresses associated therewith and redundant decoders coupled thereto. The redundant memory circuit porgrams the redundant decoders coupled to the redundant rows or columns having initially unspecified addresses to match the addresses of defective rows or columns having addresses associated therewith and disables one or more of the defective rows or columns having addresses associated therewith.

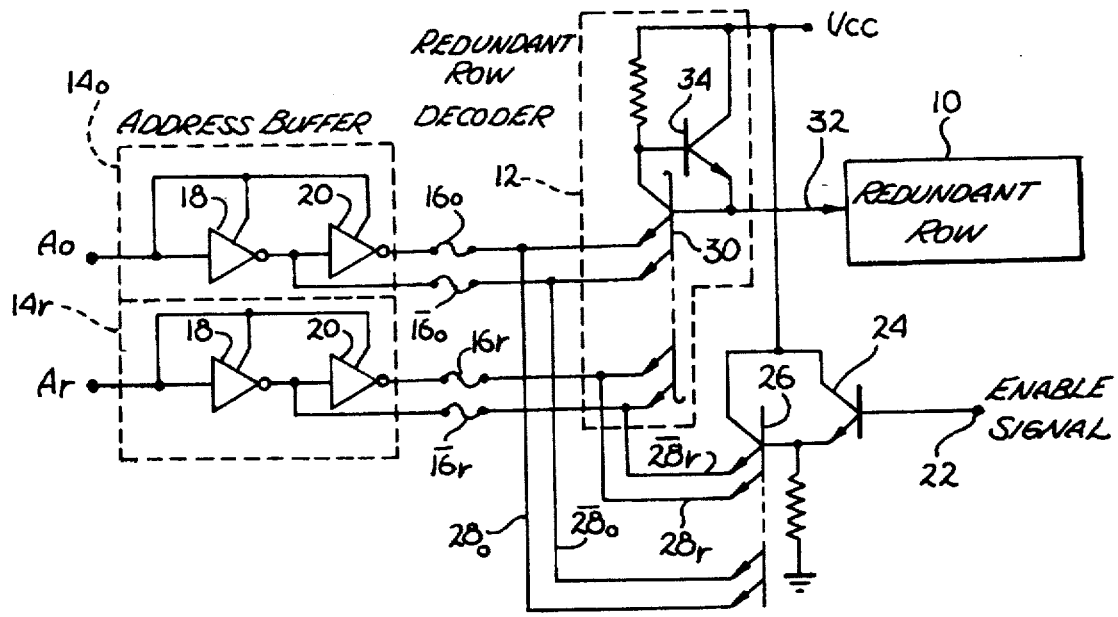

B1 4,250,570

REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEEN DETERMINED THAT:

Claims 1–7 & 9–12 are cancelled.

Claim 8 is determined to be patentable as amended.

New claims 13–15 are added and determined to be patentable.

8. [The circuit defined by claim 4] *A redundant memory circuit for a memory array comprising:*

*a memory having a preselected number of rows and columns having addresses associated therewith, each of said rows and columns having an individual decoder coupled thereto, and one or more redundant rows or columns having initially unspecified addresses associated therewith, each of said redundant rows or columns having an individual redundant decoder coupled thereto;*

*programming means for causing the redundant decoders coupled to said redundant rows or columns having initially unspecified addresses to respond only to the addresses of defective rows or columns having addresses associated therewith; means for disabling said defective rows or columns having addresses associated therewith;* programming means for causing the redundant decoders coupled to said redundant rows or columns having initially unspecified addresses to respond only to the addresses of defective rows or columns having addresses associated therewith wherein programming said means includes:

a plurality of fuses coupled to each of said redundant decoders and operable to be selectively blown;

address means for applying to one or more of said redundant rows or columns the addresses of one or more of said defective rows or columns, coupled to said fuses;

current means coupled to said fuses and coacting with said address means for allowing sufficient current to flow through selected ones of said fuses to blow said selected ones of said fuses; and wherein said fuses comprise silicon fusible links.

*13 A redundant memory circuit for a memory array, comprising:*

*a memory having a preselected number of rows and columns having addresses associated therewith, each of said rows and columns having an individual decoder coupled thereto, and one or more redundant rows or columns having initially unspecified addresses associated therewith, each of said redundant rows or columns having an individual redundant decoder coupled thereto;*

*programming means for causing the redundant decoders coupled to said redundant rows or columns having initially unspecified addresses to respond only to the addresses of defective rows or columns having addresses associated therewith, said programming means comprising at least one silicon fusible link, each silicon fusible link initially forming a low impedance path and each silicon fusible link capable of forming a high impedance path after being blown by an application of energy; and*

*means for disabling said defective rows or columns having addresses associated therewith, said means for disabling comprising means for disabling all of said rows or columns having addresses associated therewith when a programmed redundant row or column is addressed.*

*14. A redundant memory circuit for a memory array, comprising:*

*a memory having a preselected number of rows and columns, each of said rows and columns including a decoder having associated addresses, said memory further comprising one or more redundant rows or columns each including a redundant decoder having initially unspecified addresses;*

*at least one silicon fusible link coupled to each of said redundant decoders, each silicon fusible link initially forming a low impedance path and each silicon fusible link forming a high impedance path after being blown by an application of energy such that said redundant decoders having initially unspecified addresses respond to addresses of defective rows or columns of the memory after said application of energy; and*

*disabling decoder coupled to each of said redundant rows or columns, said disabling decoders disabling all of said rows or columns of said memory when one of said redundant rows or columns is addressed.*

*15. A redundant memory circuit for a memory array, comprising:*

*a memory having a preselected number of rows and columns, each of said rows and columns including a decoder having associated addresses, said memory further comprising one or more redundant rows or columns each including a redundant decoder having initially unspecified addresses;*

*at least one decoding silicon fusible link coupled to each of said redundant decoders, each decoding silicon fusible link initially forming a low impedance path and each decoding silicon fusible link forming a high impedance path after being blown by an application of energy such that said redundant decoders having initially unspecified addresses respond to addresses of defective rows or columns of the memory after said application of energy; and*

*at least one disabling silicon fusible link coupled to each of said defective rows or columns, each disabling silicon fusible link initially forming a low impedance path and each disabling silicon fusible link forming a high impedance path after being blown by an application of energy to disable said defective rows or columns.*

* * * * *